(12) United States Patent
Cauchy et al.

(10) Patent No.: US 7,627,070 B2
(45) Date of Patent: Dec. 1, 2009

(54) METHOD OF DETECTING THE RELATIVE POSITIONING OF TWO SIGNALS AND CORRESPONDING DEVICE

(75) Inventors: Xavier Cauchy, Laval (FR); Eric Salvaire, Grenoble (FR); Cédric Force, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 261 days.

(21) Appl. No.: 11/222,412

(22) Filed: Sep. 8, 2005

(65) Prior Publication Data

US 2006/0056557 A1    Mar. 16, 2006

(30) Foreign Application Priority Data

Sep. 14, 2004    (FR)    .................... 04 09735

(51) Int. Cl.
*H03D 3/24*    (2006.01)
*H03K 19/096*    (2006.01)

(52) U.S. Cl. .................. 375/376; 326/96; 375/375; 327/156

(58) Field of Classification Search ............. 326/93–95, 326/96; 327/208–212, 214–215, 224–225; 324/76.77–86
See application file for complete search history.

(56) References Cited

U.S. PATENT DOCUMENTS

| | | | | |
|---|---|---|---|---|
| 4,535,459 A * | 8/1985 | Hogge, Jr. | .................... | 375/324 |
| 4,964,117 A * | 10/1990 | Shier | ........................... | 375/357 |
| 5,027,085 A * | 6/1991 | DeVito | ........................ | 331/1 A |
| 5,159,279 A * | 10/1992 | Shenoi et al. | .................. | 327/2 |
| 5,233,617 A * | 8/1993 | Simmons et al. | ............ | 714/814 |
| 5,410,550 A * | 4/1995 | Simmons et al. | ............ | 714/814 |
| 5,498,983 A * | 3/1996 | Schoellkopf | .................... | 327/3 |
| 5,539,786 A * | 7/1996 | Snelgrove | .................... | 375/373 |
| 5,579,352 A * | 11/1996 | Llewellyn | .................... | 375/376 |
| 5,901,188 A * | 5/1999 | Roither | ........................ | 375/360 |
| 6,034,554 A * | 3/2000 | Francis et al. | .................. | 327/7 |
| 6,072,337 A * | 6/2000 | Dalmia et al. | .................. | 327/12 |
| 6,075,388 A * | 6/2000 | Dalmia | ........................ | 327/12 |
| 6,081,572 A * | 6/2000 | Filip | ........................ | 375/376 |
| 6,100,722 A * | 8/2000 | Dalmia | ........................ | 327/12 |
| 6,169,767 B1 * | 1/2001 | Strolle et al. | ................. | 375/302 |
| 6,175,603 B1 | 1/2001 | Chapman et al. | ............ | 375/354 |
| 6,225,831 B1 * | 5/2001 | Dalmia et al. | .................. | 327/12 |
| 6,545,508 B2 * | 4/2003 | Senba | ......................... | 327/20 |
| 6,700,944 B1 * | 3/2004 | Chlipala et al. | ............. | 375/376 |
| 6,756,819 B2 * | 6/2004 | Aikawa | ........................ | 326/93 |

(Continued)

FOREIGN PATENT DOCUMENTS

EP    1146413    10/2001

*Primary Examiner*—Rexford N Barnie
*Assistant Examiner*—Dylan White
(74) *Attorney, Agent, or Firm*—Lisa K. Jorgenson; Allen, Dyer, Doppelt, Milbrath & Gilchrist, P.A.

(57) ABSTRACT

A device is for detecting a relative positioning of two clock signals including a fast clock signal and a slow clock signal. The fast clock frequency may be n times greater than a slow clock frequency, and n includes an integer greater than 1. The device includes a phase logic signal generator for generating a phase logic signal from the two clock signals by assigning a predetermined logic value to the phase logic signal when a rising edge of the fast clock signal matches a predetermined location of the slow clock signal.

17 Claims, 8 Drawing Sheets

U.S. PATENT DOCUMENTS

| | | | |
|---|---|---|---|
| 6,956,923 B1 * | 10/2005 | Younis et al. | 375/375 |
| 7,084,679 B2 * | 8/2006 | Hartfiel et al. | 327/141 |
| 7,088,796 B2 * | 8/2006 | Djahanshahi et al. | 375/376 |
| 7,092,474 B2 * | 8/2006 | Cao | 375/375 |
| 7,092,484 B1 * | 8/2006 | Jensen et al. | 378/41 |
| 7,126,371 B2 * | 10/2006 | Nakano et al. | 326/38 |

* cited by examiner

Phase_random

| Case A | 0 | 1 | 0 | 1 | 0 | 1 | 0 | 1 | 0 |
|---|---|---|---|---|---|---|---|---|---|
| Case B | 1 | 0 | 1 | 0 | 1 | 0 | 1 | 0 | 1 |

Polarity

| Case A | 1 |
|---|---|
| Case B | 0 |

Phase

| 1 | 0 | 1 | 0 | 1 | 0 | 1 | 0 | 1 |
|---|---|---|---|---|---|---|---|---|

Phase_random

Case A

Case B

Polarity

Case A

Case B

Phase

METHOD OF DETECTING THE RELATIVE POSITIONING OF TWO SIGNALS AND CORRESPONDING DEVICE

FIELD OF THE INVENTION

The invention relates to the detection of the relative positioning of two signals, such as two clock signals.

BACKGROUND OF THE INVENTION

A known method of detecting the relative positioning of the clock edges of two clocks of different frequencies, proposes that the slow clock be sampled with the fast clock. In this way, it is possible to know during which cycle of the fast clock the change of level of the slow clock occurs.

However, such an approach produces stability problems because one clock signal is sampled with the aid of a signal of another clock. Moreover, the approach of the prior art greatly complicates the management of the domain of the clock.

SUMMARY OF THE INVENTION

An object of the invention comprises ascertaining, during the transmission of data, the relative positioning of the clock signals of each domain in which the frequency of one of the clock signals is n times greater than the frequency of the other clock signal where n is an integer. Stated otherwise, the objective may be to know how an edge of the clock signal having the higher frequency is situated with respect to the edge of the clock signal having the lower frequency, or vice versa.

For example, if one wishes to transmit information of the domain regulated by the clock having the higher frequency to the domain regulated by the clock having the lower frequency, it is preferable to perform the transmission on the first edge of the signal of the clock at high frequency corresponding to an edge of the signal of the clock at low frequency. One thus benefits from more time for performing the transmission of data, thereby limiting the risks of data loss.

A method aspect of the invention may be for detecting the relative positioning of two clock signals, one of these clock signals being a fast clock signal and the other a slow clock signal. The frequency of the fast clock may be n times greater than the frequency of the slow clock, and n is an integer greater than 1. A phase logic signal may be generated from the two clock signals. The phase logic signal may take a predetermined logic value when a rising edge of the fast clock signal is situated at a predetermined location of the period of the slow clock signal. Stated otherwise, a signal independent of the two clock signals may be created, the value of which indicates the moment at which the rising edge of one of the two clocks is situated at a predetermined location of the period of the other clock. For example, when an edge of one of the two clocks is aligned with an edge of the other clock. This method has the advantage of using an auxiliary signal independent of the two clock signals, and of complying with the rules of design techniques for an integrated circuit.

The edges of the two signals are preferably substantially aligned. In other embodiments, the invention also makes it possible to use non-aligned signals.

According to one embodiment, the generation of the phase logic signal may comprise autosampling one of the clock signals to obtain a first intermediate logic signal, and sampling the first intermediate logic signal with the aid of the other clock signal to obtain a second intermediate logic signal. The generation of the phase logic signal may further comprise performing a logic operation on the two intermediate signals to obtain a phase logic signal. The logic operation may be an "EXCLUSIVE OR" operation.

The invention also proposes a device for the detection of the relative positioning of two clock signals. One of these clock signals may be a fast clock signal and the other a slow clock signal. The frequency of the fast clock may be n times greater than the frequency of the slow clock, and n may be an integer greater than 1. The device may comprise a phase logic signal generator or generating means able to formulate, from the clock signals a phase logic signal. The phase logic signal may take a predetermined logic value when a rising edge of the fast clock signal is situated at a predetermined location of the period of the slow clock signal.

A first and a second sequential element may be flip-flops. In one embodiment, the device may comprise an "EXCLUSIVE OR" logic gate.

Another embodiment of the invention is directed to a system for controlled multiplexing of data comprising a device for the detection of the relative positioning of two clock signals as defined hereinabove. The system may comprise a number p of sequential input elements regulated by the slow clock signal and respectively connected to a multiplexer controlled by a control signal by way of a modulo p counter. The modulo p counter may be regulated by the fast clock signal and controlled by the phase logic signal. The system may further comprise a sequential output element regulated by the fast clock signal and receiving as an input the output signal of the multiplexer.

The phase logic signal generator or the generating means advantageously may comprise a first sequential element whose output is looped back to the input, is regulated by one of the clock signals, and is able to deliver a first intermediate logic signal. The phase logic signal generator may also comprise a second sequential element fed by the first intermediate logic signal, regulated by the signal arising from the other clock, and which is able to deliver a second intermediate logic signal. The phase logic signal generator may further comprise a logic element connected to the output of the first and second sequential elements. The first and the second sequential element may be flip-flops. The logic element may be an "EXCLUSIVE OR" logic gate.

The applications of a device according to the invention are numerous. A few of them will now be cited by way of non-limiting examples.

The device for the detection of the relative positioning of two clock signals may be part of a system for synchronizing the transmission of data. The system may comprise the device for the detection of the relative positioning of two clock signals as defined hereinabove. The system may also comprise a sequential input element regulated by one of the clock signals and the output of which is looped back to the input by way of a selector controlled by the phase logic signal delivered by the detection device, the selector also receiving as input said data to be transmitted. The system may further comprise a sequential output element receiving as an input the signal delivered as output from the sequential input element and regulated by the other clock signal.

An alternative system is for the controlled multiplexing of data. The system may comprise a device for the detection of the relative positioning of two clock signals as defined hereinabove. The system may also comprise p sequential input elements regulated by the slow clock signal and respectively connected to a multiplexer controlled by a control signal by way of a modulo p counter. The modulo p counter may be regulated by the fast clock signal and controlled by the phase logic signal delivered by the detection device. The system may further comprise a sequential output element regulated by the fast clock signal and receiving as input the output signal of the multiplexer.

Another alternative system is for a system of polyphase filters. The system may comprise a device for the detection of the relative positioning of two clock signals as defined hereinabove, and a sequential input element regulated by the slow clock signal for receiving input data. The system may also include a multiplexer for receiving in parallel n predetermined coefficients, and a mixer whose output is connected to the input of an adder and able to receive the n predetermined coefficients delivered by the multiplexer. The system may further comprise a modulo n counter, which is controlled by the phase logic signal delivered by the detection device and regulated by the fast clock signal. The modulo n counter controls the multiplexer in such a way as to order the delivery of the n predetermined coefficients. The system may also comprise a sequential output element connected to the output of the multiplexer and regulated by the fast clock signal.

DETAILED DESCRIPTION OF THE PREFERRED EMBODIMENTS

Figure 1:
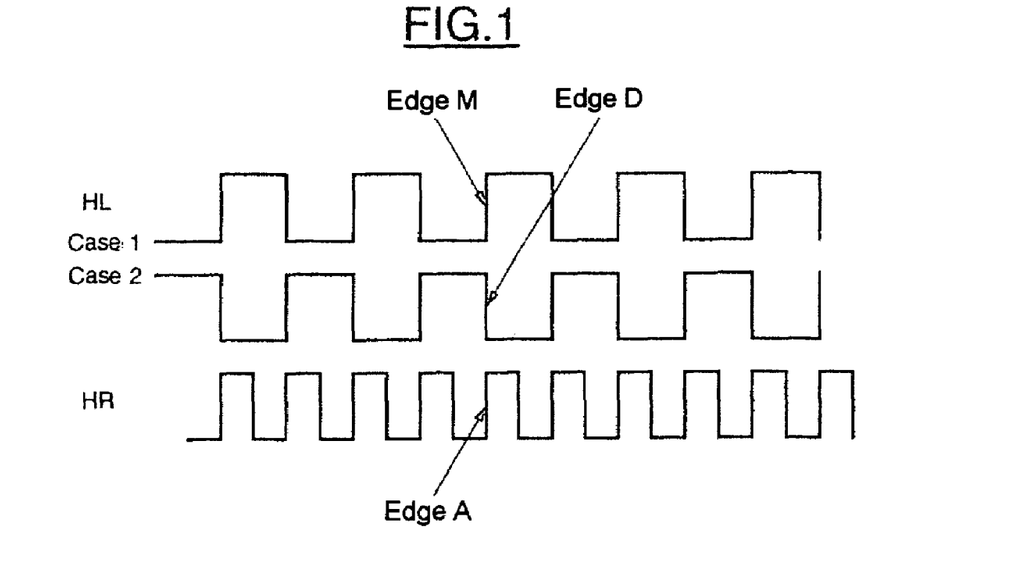
FIG. 1 represents clock signals defining two clock domains where n=2 in accordance with the invention.

FIG. 1 represents two clock signals HL and HR, defining two distinct clock domains, in the case where the signal HL is twice as fast as the signal HR (n=2). Two different cases will be considered for the clock signal HL.

Case 1 illustrates a first configuration where the two clocks are active on edges of like polarity such that a rising edge A of the fast clock HR corresponds to a rising edge M of the slow clock HL. Case 2 illustrates another configuration where the two clocks are active on edges of opposite polarities such that a rising edge A of the fast clock HR corresponds to a falling edge D of the slow clock HL.

In the example illustrated in FIG. 1, the two clock signals HL and HR are aligned, that is to say an edge of the clock signal Edge A, corresponds to an edge of the clock signal HL. However, during the embodiment of the circuit, the technology of the electronic components used may generate a shift between the edges of the clock signals.

Furthermore, the frequency of the clock signal HR is n times higher than the frequency of the clock signal HL. In this example, n=2, however, n may be any integer greater than 1.

Figure 2:
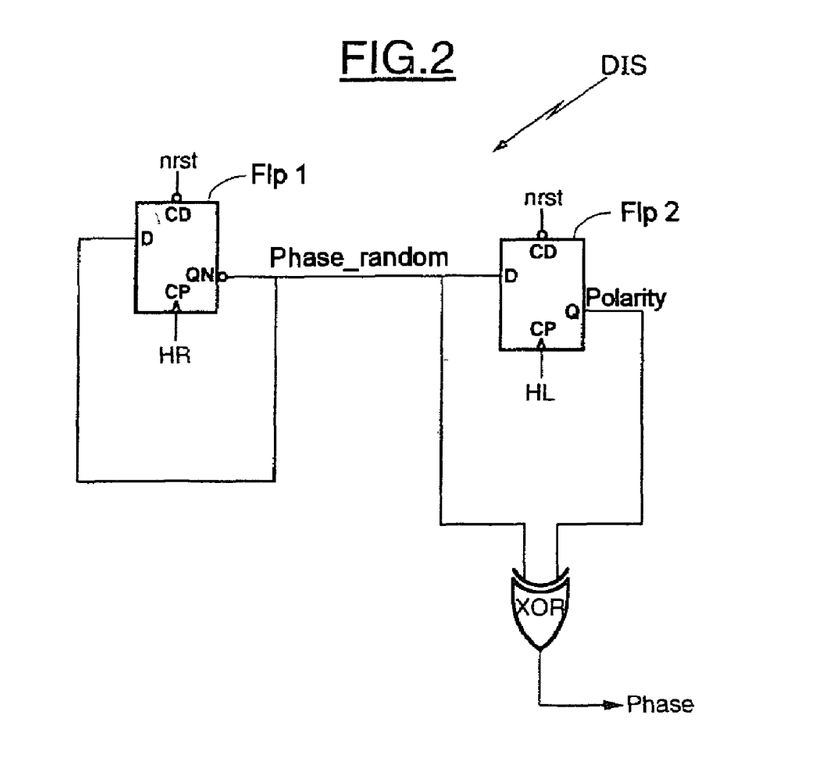
FIG. 2 represents a first embodiment of a device for detecting a relative positioning of the two clock signals illustrated in FIG. 1.

Referring now to FIG. 2, a device DIS in accordance with the invention is illustrated. The device DIS comprises a first sequential element Flp 1, which includes a flip-flop D, for example. Hereinbelow, it will be considered that the sequential elements used in the examples described are flip-flops controlled by a reset to zero signal nrst.

The flip-flop Flp 1 is regulated by the fast clock signal HR. The fast clock signal HR has the higher frequency as is represented in FIG. 1. Additionally, the output QN of the flip-flop Flp 1 is looped back to its input D. The flip-flop Flp 1 outputs a first intermediate logic signal Phase_random.

The device DIS also comprises a second sequential element Flp 2. The flip-flop Flp 2 is regulated by the slow clock signal HL, which has the lower frequency. For this device, the frequency of the fast clock HR may be twice as fast as that of the slow clock HL (n=2). The input D of the second flip-flop Flp 2 is connected to the output QN of the first flip-flop Flp 1. The second flip-flop Flp 2 therefore receives as input the intermediate logic signal Phase_random. Additionally, the second flip-flop Flp 2 delivers via its output terminal Q a second intermediate logic signal Polarity. The first and second intermediate logic signals, Phase_random and Polarity are delivered as input to an EXCLUSIVE OR logic gate, XOR. The XOR logic gate then delivers an output signal Phase, as a function of the two input signals Phase_random and Polarity.

Figure 3:
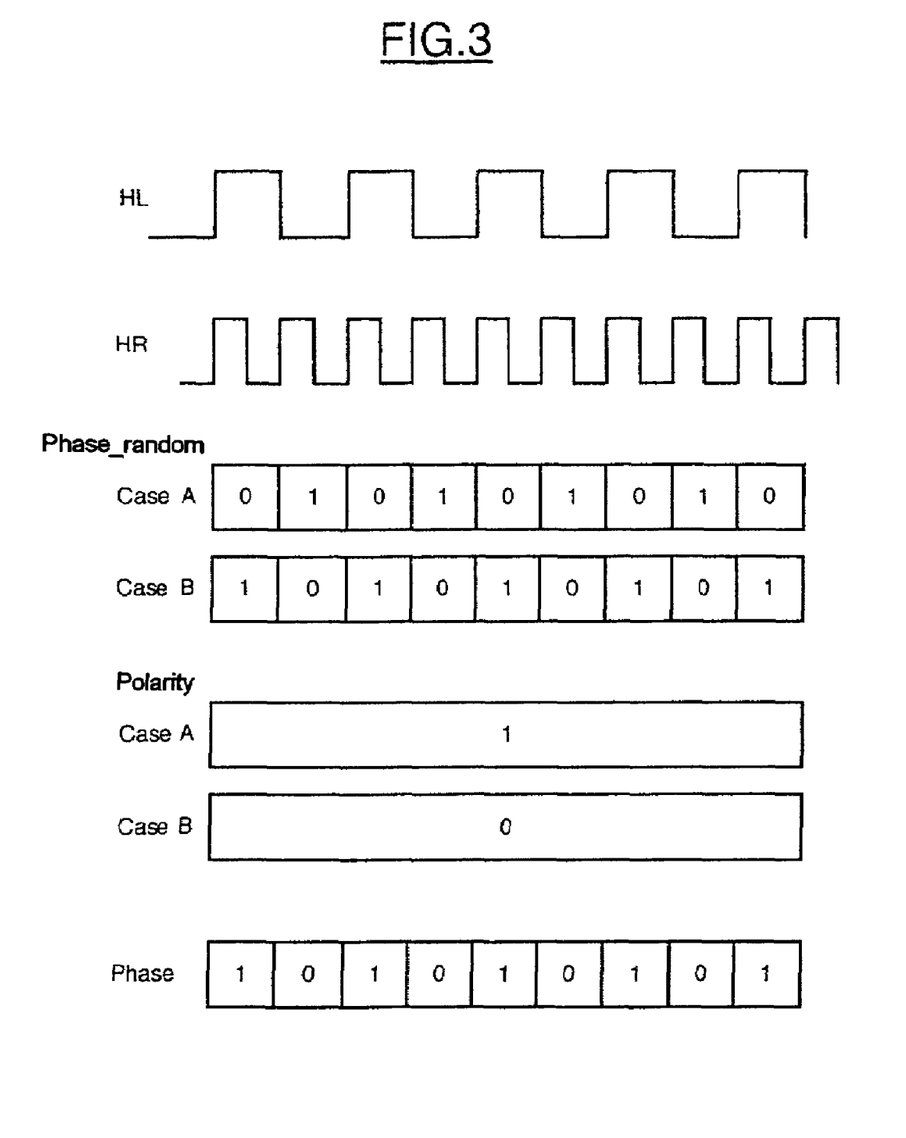
FIG. 3 illustrates signals implemented by the device of FIG. 2.

Referring now additionally to FIG. 3 which describes the profile of these signals implemented in the device DIS of FIG. 2. The fast and slow clock signals HR and HL are the signals represented in FIG. 1. The frequency of the fast clock signal HR is, in this example, twice as high as the frequency of the slow clock signal HL.

Two cases relating to the values taken by the signal Phase_random will be considered. Case A represents the situation where the first value taken by the signal Phase_random is "0". In this case, the signal Phase_random takes successively the values "0" and then "1", at the frequency of the fast clock signal HR.

Case B represents the situation where the first value taken by the signal Phase_random is "1". In this case, the signal Phase_random takes successively the values "1" and then "0", at the frequency of the fast clock signal HR.

Accordingly, as the values of the signal Phase_random follow case A or case B, the signal generated by the flip-flop Flp 2, Polarity, evolves according to two cases, case A or case B. The signal Polarity evolves according to case A if the signal Phase_random evolves also according to case A. In this case, the signal Polarity takes the value "1" regardless of the value of the signal Phase_random. The signal Polarity evolves according to case B if the signal Phase_random evolves according to case B. In this case, the signal Polarity takes the value "0" regardless of the value taken by the signal Phase_random.

The signal Phase is generated by the "EXCLUSIVE OR" logic gate, XOR. It is recalled that according to the truth table of the "EXCLUSIVE OR" function, the output signal equals "1" if the two input signals are in a different state. Otherwise, the output signal equals "0" if the two input signals are in an identical state.

Thus, regardless of the case of the evolution of the values of the signals Phase_random and Polarity, case A or case B, the evolution of the signal phase is the same, that is to say it takes successively the values "1" then "0". According to the hypotheses defined for the embodiment illustrated, the "1" logic value signifies that a rising edge of the fast clock signal HR corresponds to a rising edge of the signal of the slow clock HL.

Figure 4:
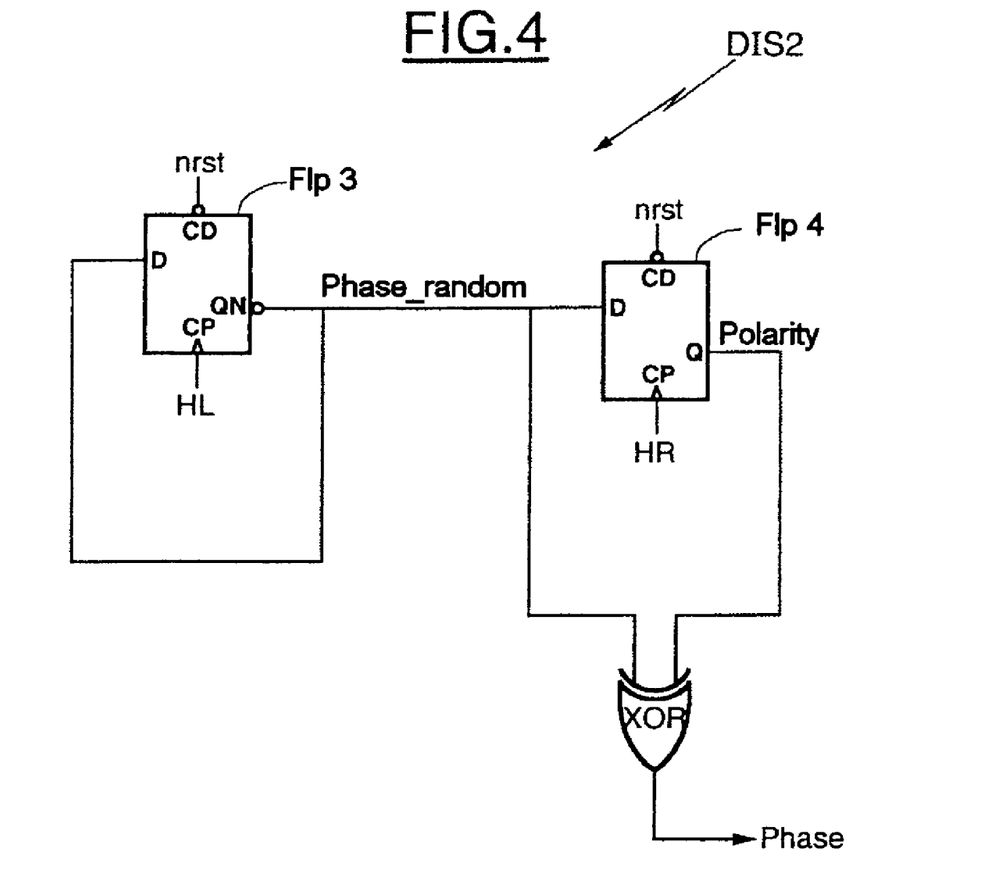
FIG. 4 represents a second embodiment of a device for detecting the relative positioning of two clock signals for any n in accordance with the invention.

Reference is now made to FIG. 4 which represents a variant of the device illustrated in FIG. 2, operating with any ratio n between the two clocks. The first sequential element Flp 3 of the device DIS 2 of FIG. 4 is regulated by the slow clock signal HL. The second sequential element Flp 4 is regulated by the fast clock signal HR. Thus, the role of the two sequential elements of the device DIS in FIG. 2 have been reversed.

Figure 5:
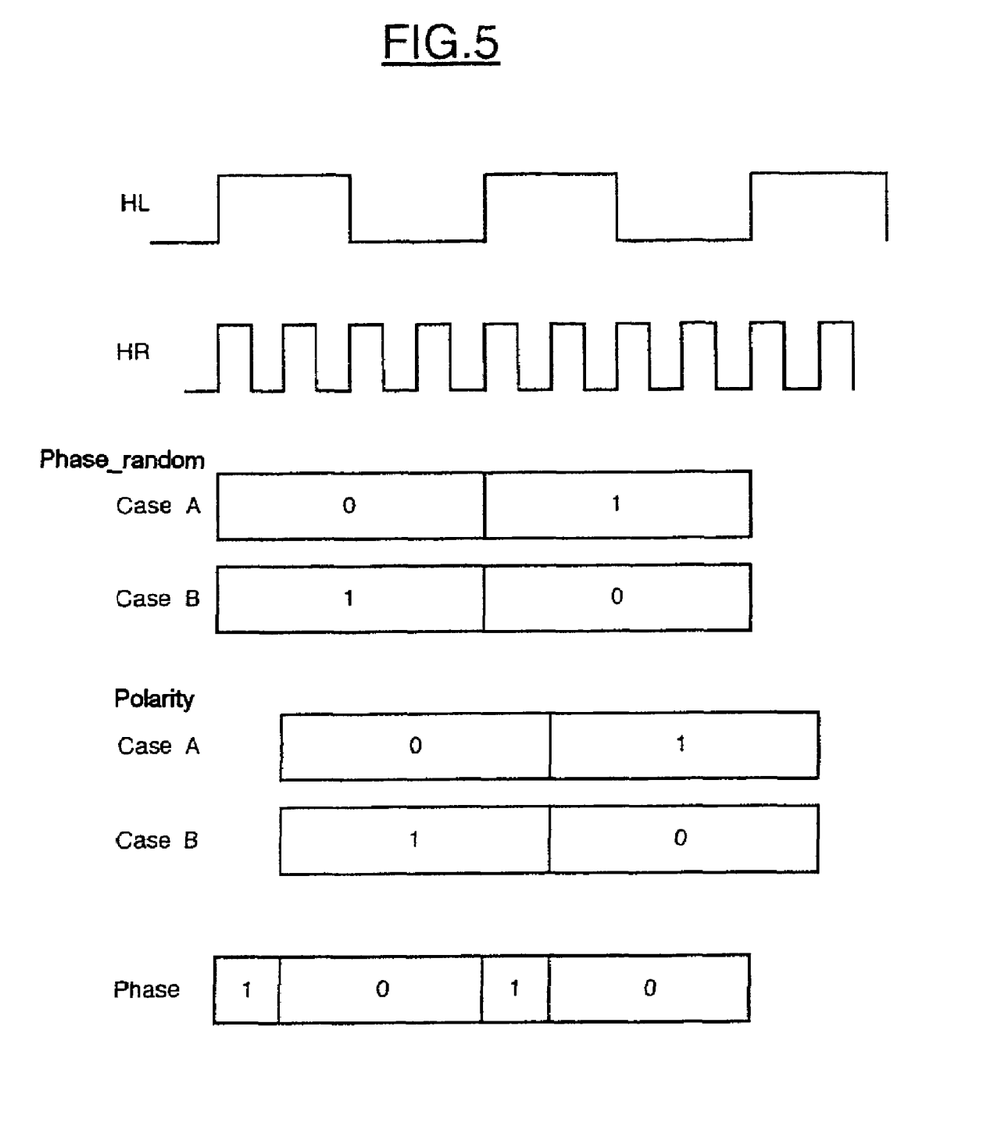
FIG. 5 illustrates signals implemented by the device of FIG. 4.

Reference is now made to FIG. 5 which illustrates the evolution of the signals implemented in the variant represented in FIG. 4. The slow and fast clock signals HL and HR are generated such that the frequency of the fast clock signal HR is three times higher than the frequency of the slow clock signal HL, for example. The signal Phase_random may evolve according to two distinct cases.

The first case illustrates the situation where the first value taken by the signal Phase_random is "0". In this case, the signal Phase_random takes successively the values "0" and then "1" at the frequency of the signal of the slow clock HL, which regulates the first sequential element Flp 3. If the signal Phase_random evolves according to case B, then it takes successively the values "1" and then "0" at the frequency of the clock signal HL.

Just as for the device DIS of FIG. 2, the signal Polarity evolves also according to two cases, case A and case B, respectively associated with case A and with case B of the signal Phase_random. If the signal Polarity evolves according to case A, then it takes successively the values "0" and then "1" at the frequency of the signal of the slow clock HL. Conversely, if the signal Polarity evolves according to case B, then it takes successively the values "1" and then "0" at the frequency of the signal of the slow clock HL. Thus, regardless of the case according to which the signals Phase_random and Polarity evolve, the signal Phase generated by the "EXCLUSIVE OR" logic gate XOR, takes the value "1" when a rising edge of the signal of the fast clock HR corresponds to a rising edge of the signal of the slow clock HL, or the value "0" otherwise.

Figure 6:
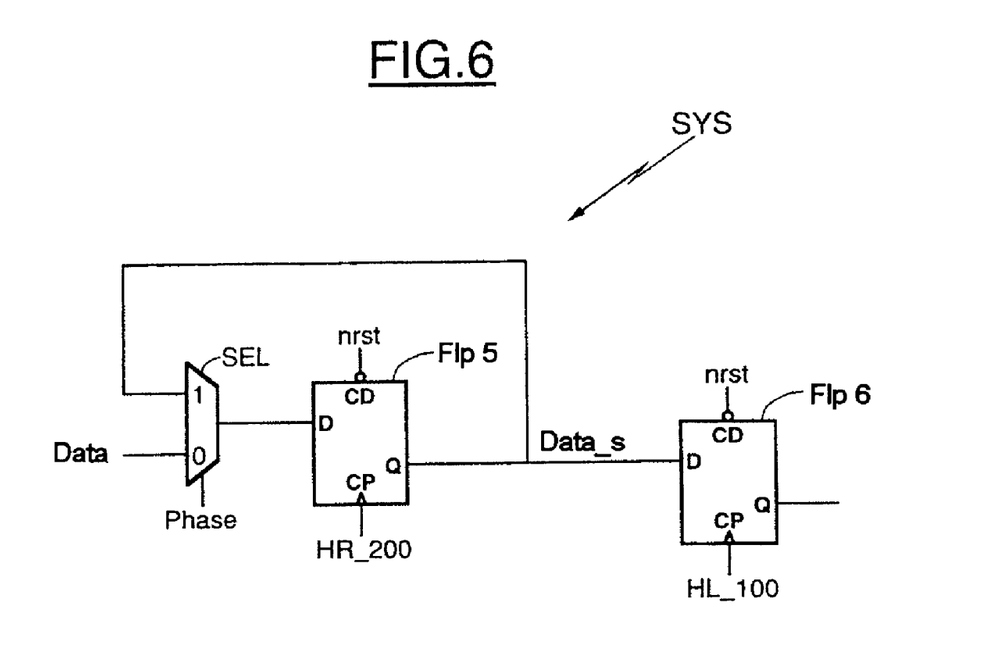
FIG. 6 represents an exemplary application of the device illustrated in FIG. 2 or 4.

A first exemplary use of the device DIS represented in FIG. 2 is illustrated in FIG. 6. In this example two clock signals are used, a first fast clock signal H_200 whose frequency is 200 MHz and a second slow clock signal H_100 whose frequency is 100 MHz.

The system SYS represents a system for synchronized transmission of data between two domains of different frequencies. An input flip-flop Flp 5 is regulated by the fast clock signal HR_200. The flip-flop Flp 5 is also controlled by a reset to zero signal nrst. The output Q of the flip-flop Flp 5 is looped back to its input D by way of a selector SEL which also receives data Data as input. Additionally, the selector SEL is controlled by a control signal which is the Phase logic signal, generated by the device DIS represented in FIG. 2. According to the value of the Phase logic signal, the selector SEL transmits the data Data to the input D of the flip-flop Flp 5. The flip-flop Flp 5 delivers data Data_s via its output Q.

The output Q of the flip-flop Flp 5 is also connected to the input D of an output flip-flop Flp 6, controlled by a reset to zero signal nrst. The flip-flop Flp 6 is regulated by the slow clock signal HL_100.

The flip-flop Flp 6 receives as input the data Data_s delivered by the output Q of the flip-flop Flp 5. Thus, by virtue of the system SYS, it is possible to check that at each clock tick of the signal of the fast clock HR, the data may be delivered so that the time available during the exchange of data is as great as possible. Stated otherwise, a cycle of n period of the faster clock signal (in this example n is equal to 2) is guaranteed so as to allow the exchange of data.

Figure 7:
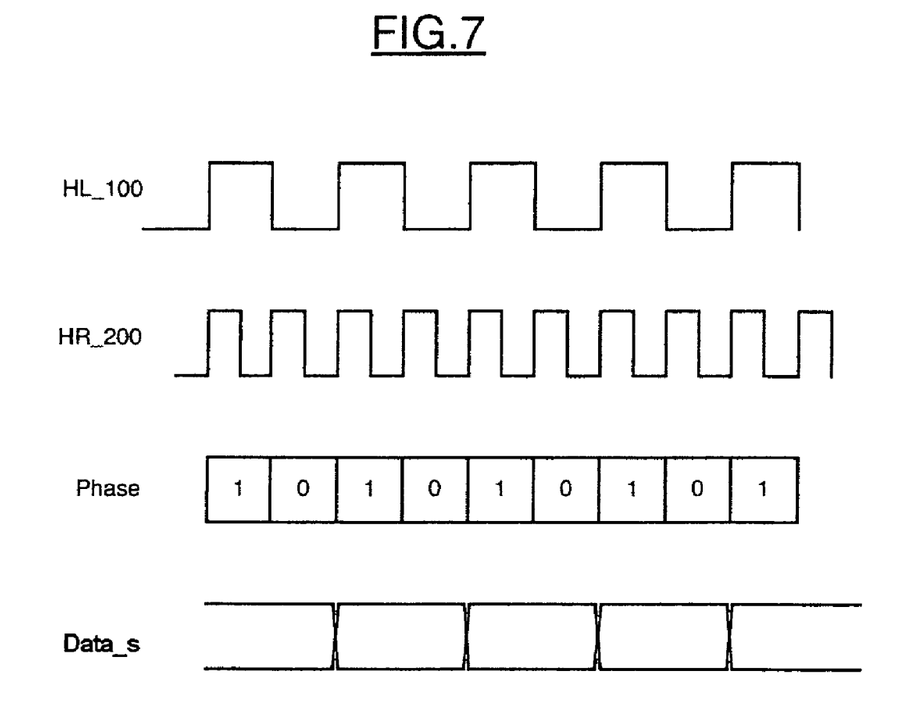
FIG. 7 illustrates signals implemented by the device of FIG. 6.

If reference is made to FIG. 7, which illustrates the signals implemented in the system SYS of FIG. 6, it is possible to see the clock signals HL_100 and HR_200, such that the frequency of the clock signal HR_200 is 200 MHz and that of the signal of the clock HL_100 is 100 MHz. The signal Phase takes successively the values "1" then "0". When the signal Phase takes the value "1", a rising edge of the clock signal HR_200 corresponds to a rising edge of the clock signal HL_100. Thus, the data Data_s are exchanged when a rising edge of the signal of the fast clock HR_200 corresponds to a rising edge of the clock signal HL_100.

Figure 8:
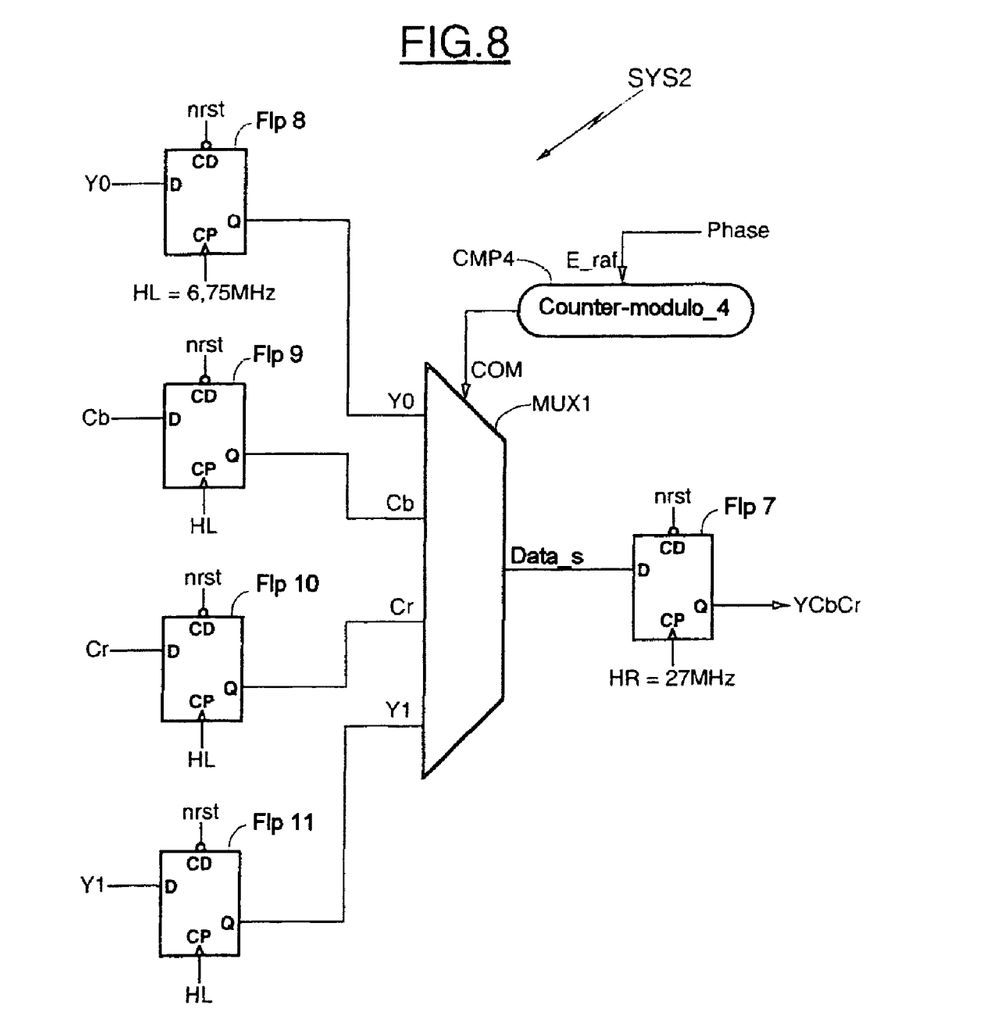
FIG. 8 represents another exemplary application of the device illustrated in FIG. 4.

Reference will now be made to FIG. 8. The system SYS 2 represents a second use of the device represented in FIG. 2. The system SYS 2 is a system for the controlled multiplexing of data, such as to transmit in a predetermined order coefficients representing the luminance and the blue and red chrominances of a digital video application, for example.

The system SYS 2 comprises four flip-flops Flp 8, Flp 9, Flp 10 and Flp 11 in parallel. Each of the four flip-flops is controlled by a reset to zero signal nrst and is regulated by the slow clock signal HL, which in this example is equal to 6.75 MHz. The four flip-flops Flp 8, Flp 9, Flp 10 and Flp 11 are respectively fed with the coefficients of the luminance Y0, of the blue chrominance Cb, of the red chrominance Cr and of luminance Y1. Via their output terminals Q, they deliver the data which they receive on their input terminal D as a function of the signal of the slow clock HL.

These output data are delivered to a multiplexer MUX1, controlled by a counter-modulo_4, CMP4. The counter-modulo_4 CMP4 receives on an input E_raf the logic signal Phase, delivered by the device represented in FIG. 2. The signal Phase is intended to control the refreshing of the counter-modulo_4, CMP4. As a function of the control signal COM delivered by the counter-modulo_4 CMP4, the multiplexer MUX 1 outputs in order the data Data_s corresponding to the planes Y0, Cb, Cr, and Y1.

The data Data_s are delivered on the input D of a flip-flop Flp 7. The flip-flop Flp 7 is controlled by a reset to zero signal nrst and regulated by the fast clock signal HR. In this example, the frequency of the fast clock signal is 27 MHz. The flip-flop Flp 7 delivers via its output terminal Q, the data stream YCbYCr at the frequency of the signal of the fast clock HR, which is 27 MHz.

Figure 9:
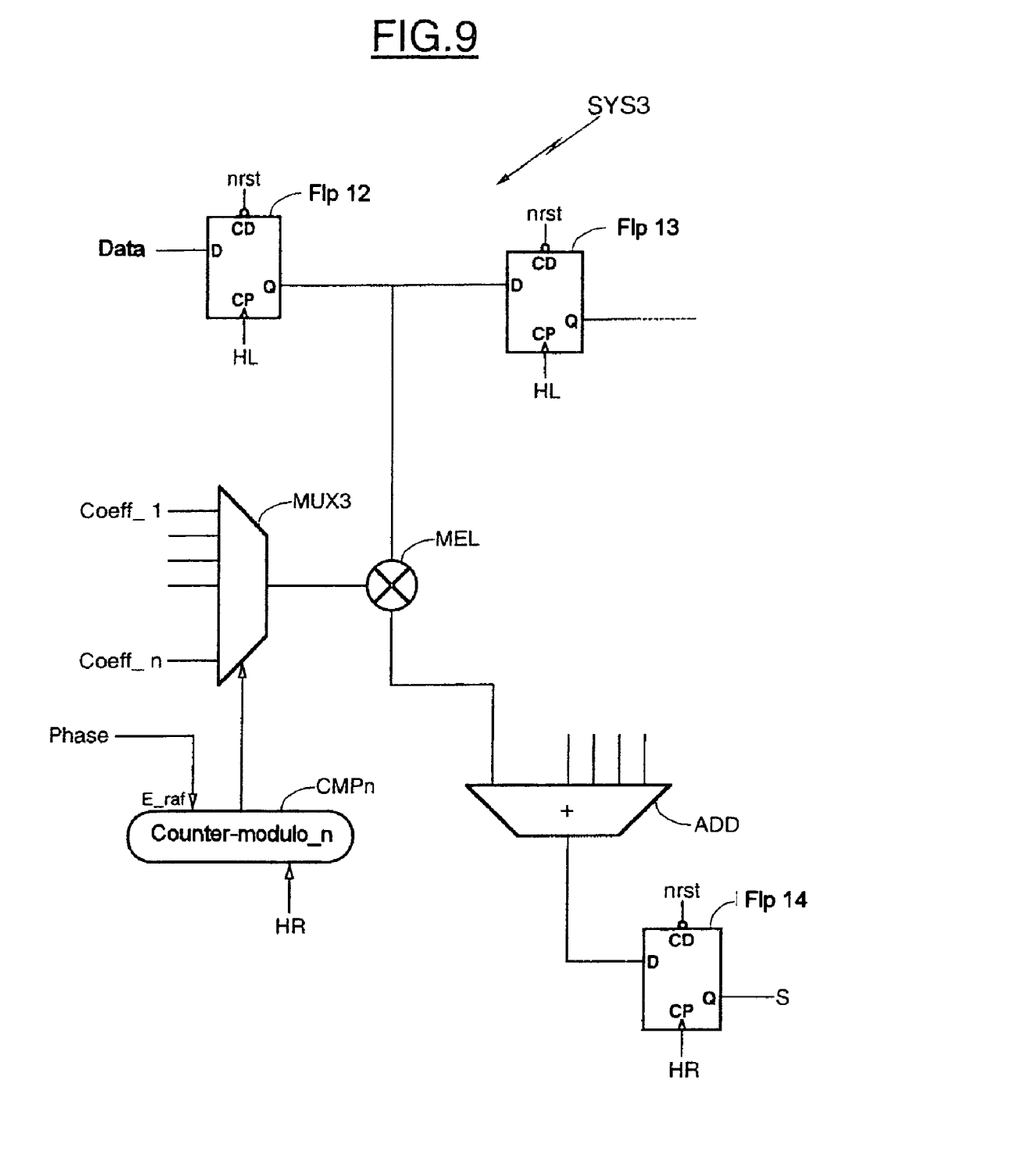
FIG. 9 represents another exemplary application of the device illustrated in FIG. 4.

Reference is now made to FIG. 9 which represents another exemplary use of the device represented in FIG. 2. The system SYS 3 of FIG. 9 represents a system for controlled multiplexing of data. The system SYS 3 comprises a first flip-flop Flp 12 controlled by a reset to zero signal nrst and regulated by a slow clock signal HL. The flip-flop Flp 12 receives as input data Data, that it delivers via its output terminal Q to a mixer MEL. The mixer MEL also receives as input data arising from a multiplexer MUX 3. The multiplexer MUX 3 receives as input n coefficients Coeff_1, . . . , Coeff_n.

Furthermore, the multiplexer MUX 3 is controlled by an output signal arising from a modulo n counter, CMPn. The modulo n counter CMPn is regulated by the fast clock signal HR. Furthermore, it is controlled by the logic signal Phase, received on its input E_raf and able to control the refreshing of the modulo n counter, CMPn. Thus, the multiplexer MUX3 controlled by the modulo n counter CMPn, makes it possible to successively apply the n coefficients, Coeff_1, . . . , Coeff_n, to the data delivered by the flip-flop Flp 12. The application of the n coefficients is effected by way of the mixer MEL. The output signal from the mixer MEL is delivered to an adder ADD. The adder ADD may also receive as input, in parallel, other data arising from other flip-flops, for example the flip-flop Flp 13, connected in series with the flip-flop Flp 12.

The adder ADD outputs a resultant signal formulated by adding up the various data delivered as input to the adder ADD. The resultant signal delivered by the adder ADD is transmitted to an output flip-flop Flp 14 controlled by a reset to zero signal nrst and regulated by the fast clock signal HR. The flip-flop Flp 14 then outputs an output signal S at the frequency of the signal of the fast clock HR. It is noted that in this example, the frequency of the fast clock HR is n times higher than the frequency of the signal of the slow clock HL, and n being the number of coefficients delivered to the input of the multiplexer MUX3.

That which is claimed is:

1. A method of detecting a relative positioning of two clock signals comprising a fast clock signal having a fast clock frequency and a slow clock signal having a slow clock frequency, and where the fast clock frequency is n times greater than the slow clock frequency, and n comprises an integer greater than 1, the method comprising:
   generating a phase logic signal having a first logic value when a rising edge of the fast clock signal is situated at one of a rising edge and a falling edge of the slow clock signal; and
   multiplexing data based upon the phase logic signal.

2. The method according to claim 1 wherein the two clock signals include substantially aligned edges.

3. The method according to claim 2 wherein the generation of the phase logic signal comprises:
   autosampling one of the two clock signals to obtain a first intermediate logic signal;
   sampling the first intermediate logic signal with the other clock signal so as to obtain a second intermediate logic signal; and
   performing a logic operation on the first and second intermediate signals to obtain the phase logic signal.

4. The method according to claim 3 wherein the logic operation comprises an "EXCLUSIVE OR" operation.

5. A method of detecting a relative positioning of two clock signals comprising a fast clock signal having a fast clock frequency and a slow clock signal having a slow clock frequency, and where the fast clock frequency is n times greater than the slow clock frequency, and n comprises an integer greater than 1, the method comprising:
   generating a phase logic signal having a first logic value when a rising edge of the fast clock signal is situated at a one of a rising edge and a falling edge of the slow clock signal, wherein the generation of the phase logic signal comprises
      autosampling one of the two clock signals to obtain a first intermediate logic signal,
      sampling the first intermediate logic signal with the other clock signal so as to obtain a second intermediate logic signal, and
      performing a logic operation on the first and second intermediate signals to obtain the phase logic signal; and
   multiplexing data based upon the phase logic signal.

6. The method according to claim 5 wherein the logic operation comprises an "EXCLUSIVE OR" operation.

7. A device for detecting a relative positioning of two clock signals comprising a fast clock signal having a fast clock frequency and a slow clock signal having a slow clock frequency, and where the fast clock frequency is n times greater than the slow clock frequency, and n comprises an integer greater than 1, the device comprising:
   a phase logic signal generator comprising respective inputs for the fast and slow clock signals for generating a phase logic signal having a first logic value at an output when a rising edge of the fast clock signal is situated at a one of a rising edge and a falling edge of the slow clock signal; and
   a circuit cooperating with said phase logic signal generator for multiplexing data based upon the phase logic signal.

8. The device according to claim 7 wherein said phase logic signal generator comprises:
   a first sequential element having an output looped back to an input, regulated by one of the clock signals, and delivering a first intermediate logic signal;
   a second sequential element fed by the first intermediate logic signal, regulated by the other clock signal, and delivering a second intermediate logic signal; and
   a logic element connected to said first and second sequential elements to generate the phase logic signal based upon the first and second intermediate logic signals.

9. The device according to claim 8 wherein the first and the second sequential element each comprises a flip-flop.

10. The device according to claim 9 wherein the logic element comprises an "EXCLUSIVE OR" logic gate.

11. A device comprising:
    a phase logic signal generator comprising respective inputs for the fast and slow clock signals for generating a phase logic signal having a first logic value at an output when a rising edge of the fast clock signal is situated at a one of a rising edge and a falling edge of the slow clock signal;
    a circuit cooperating with said phase logic signal generator for synchronizing data transmission based upon said phase logic signal and for multiplexing data based upon the phase logic signal.

12. The device according to claim 11 wherein said circuit comprises:
    a selector having an input and controlled by said phase logic signal received at the input, and said selector also receiving data to be transmitted at the input;
    a third sequential input element regulated by one of the clock signals and having an output looped back to an input via said selector; and
    a fourth sequential output element regulated by the other clock signal and having an input for receiving a signal generated by the output of said third sequential input element.

13. A device comprising:
    a phase logic signal generator comprising respective inputs for the fast and slow clock signals for generating a phase logic signal having a first logic value at an output when a rising edge of the fast clock signal is situated at one of a rising edge and a falling edge of the slow clock signal; and
    a circuit cooperating with said phase logic signal generator for controlled multiplexing of data based upon said phase logic signal.

14. The device according to claim 13 wherein said circuit comprises:
    a counter regulated by said fast clock signal and controlled by said phase logic signal;
    a multiplexer controlled by a control signal received from said counter;
    a plurality of sequential input elements regulated by said slow clock signal and each respectively connected to said multiplexer; and a sequential output element having an input and regulated by said fast clock signal and receiving at the input a signal from said multiplexer.

15. A device comprising:
a phase logic signal generator comprising respective inputs for the fast and slow clock signals for generating a phase logic signal having a first logic value at an output when a rising edge of the fast clock signal is situated at one of a rising edge and a falling edge of the slow clock signal; and a circuit comprising polyphase filters cooperating with said phase logic signal generator.

16. The device according to claim 15 wherein said circuit comprises:
a sequential input element regulated by said slow clock signal for receiving input data;

a multiplexer having an input and an output, the input for receiving a plurality of coefficients;

an adder having an input;

a mixer having an input and an output, the output connected to the input of said adder, and the input connected to said multiplexer for receiving the plurality of coefficients;

a counter controlled by said phase logic signal and regulated by the fast clock signal, said counter for controlling a delivery order of the plurality of coefficients output by said multiplexer; and a sequential output element connected to the output of the multiplexer and regulated by said fast clock signal.

17. The device according to claim 16 wherein said multiplexer receives the plurality of coefficients in parallel.

* * * * *

UNITED STATES PATENT AND TRADEMARK OFFICE
CERTIFICATE OF CORRECTION

| | | |
|---|---|---|
| PATENT NO. | : 7,627,070 B2 | Page 1 of 1 |
| APPLICATION NO. | : 11/222412 | |
| DATED | : December 1, 2009 | |
| INVENTOR(S) | : Cauchy et al. | |

It is certified that error appears in the above-identified patent and that said Letters Patent is hereby corrected as shown below:

Title page, item (*) Notice:  should read as follows:  Subject to any disclaimer, the term of this patent is extended or adjusted under 35 U.S.C. 154(b) by 261 days.

Column 5, Line 6      Delete: "role"
                      Insert: --roles--

Column 7, Line 48     Delete: "a one"
                      Insert: --one--

Column 8, Line 4      Delete: "a one"
                      Insert: --one--

Column 8, Line 29     Delete: "a one"
                      Insert: --one--

Signed and Sealed this

Fourteenth Day of September, 2010

David J. Kappos
*Director of the United States Patent and Trademark Office*